United States Patent [19]

Agarwala

[11] Patent Number: 5,338,983
[45] Date of Patent: Aug. 16, 1994

[54] APPLICATION SPECIFIC EXCLUSIVE OF BASED LOGIC MODULE ARCHITECTURE FOR FPGAS

[75] Inventor: Manisha Agarwala, Dallas, Tex.

[73] Assignee: Texas Instruments Incorporated, Dallas, Tex.

[21] Appl. No.: 166,330

[22] Filed: Dec. 10, 1993

Related U.S. Application Data

[63] Continuation of Ser. No. 35,554, Mar. 23, 1993, abandoned, which is a continuation of Ser. No. 783,301, Oct. 28, 1991, abandoned.

[51] Int. Cl.$^5$ .............................................. H03K 19/177
[52] U.S. Cl. .................................... 307/465; 307/243; 307/465.1; 340/825.87
[58] Field of Search .............................. 307/465–469, 307/465.1, 471.243; 340/825.85–825.91

[56] References Cited

U.S. PATENT DOCUMENTS

| | | | |
|---|---|---|---|
| 4,918,440 | 4/1990 | Funtek | 307/465 X |
| 4,992,680 | 2/1991 | Benedetti et al. | 307/465 |
| 5,003,200 | 3/1991 | Sakamoto | 307/465 |
| 5,144,166 | 9/1992 | Camarota et al. | 307/465.1 |

*Primary Examiner*—David R. Hudspeth
*Attorney, Agent, or Firm*—Wade James Brady; Richard L. Donaldson

[57] ABSTRACT

A logic module (20) includes five input terminals (a-e), two output terminals (F1, F2), and control logic (22, 24, 26, 28, 30, 32, 36) for selectively coupling one or more of the input terminals to one of the output terminals. First and second input terminals (a, b) are connected to inputs of a first XOR gate (22); a third input terminal (c) is connected to one input of a multiplexor (24) through an inverter (26); a fourth input terminal (d) is connected to the other input of the multiplexor (24) and to one input of a first NAND gate (28); and a fifth input terminal (e) is connected to one input of a second XOR gate (30) and to one input of a second NAND gate (32). The first XOR gate (22) has its output connected to the other input of the first NAND gate (28) and to the control input of the multiplexor (24). The output of the multiplexor (24) is connected to the other inputs of the second XOR gate (30) and second NAND gate (32). The outputs of the first and second NAND gates (28, 32) are connected to the inputs of a third NAND gate (36). The outputs of the third NAND gate (36) and second XOR gate (30) are the output terminals (F2, F1) of the logic module (10). The configuration of the logic module (20) permits implementation of adders and subtractors for DSPs with only one logic module.

10 Claims, 4 Drawing Sheets

(DSPLM)

8 INPUTS
9 TWO-INPUT GATES
5 INVERTERS (MBLM)

S=0 => out=D0
S=1 => out=D1

CSA: $S = \bar{A}\bar{B}C + \bar{A}B\bar{C} + A\bar{B}\bar{C} + ABC$
$C = AB + BC + AC$ CSS: $S = \bar{A}\bar{B}C + A\bar{B}C + AB\bar{C} + \bar{A}BC$
$C = A\bar{B} + \bar{B}C + AC$

APPLICATION SPECIFIC EXCLUSIVE OF BASED LOGIC MODULE ARCHITECTURE FOR FPGAS

This application is a continuation of application Ser. No. 08/035,554, filed Mar. 23, 1993 abandoned, which is a continuation of Ser. No. 07/783,301, filed Oct. 28, 1991, abandoned.

FIELD OF THE INVENTION

This invention relates generally to field-programmable gate arrays (FPGAs), and more specifically to application specific logic module architecture for FPGAs.

BACKGROUND OF THE INVENTION

Field Programmable Gate Arrays (FPGA) is a rapidly evolving technology in the Application Specific Integrated Circuit (ASIC) area. Their increasing use in ASICs is due to the fact that they combine the flexibility of mask programmable gate arrays (MPGAs) with the convenience of field programmability.

A typical FPGA architecture consists of two-dimensional array of logic modules which can be selectively connected using a programmable interconnect structure as shown in FIG. 1. It has rows of logic modules interspersed with routing channels consisting of predefined tracks. The tracks are segmented and two adjacent segments can be connected by programming a horizontal antifuse.

In addition to the horizontal antifuses, there are crosspoint antifuses which are used to make connections between the horizontal and the vertical tracks. Such an architecture has typically been based on a logic module which incorporates multiplexer (Mux) based logic design, as shown in FIG. 2. The output of each logic module is connected to a dedicated vertical segment. Other vertical segments just pass through the modules, serving as feed-through between channels.

The choice of logic module architecture and the method by which the modules are configured directly affects the usefulness and performance of an FPGA for a particular application. Performance depends mainly on the number of antifuses used and the critical path delay.

Each antifuse used increases both resistance and capacitance of a net, and depending on the technology used, these values can be detrimentally high. The delay of the critical path through a circuit depends on the number of logic levels used to implement it. If multiple levels of logic modules are used to implement a function, the critical path delay may increase. Clock distribution may also influence critical path delay. However, since dedicated paths are used for clock distribution, delay attributable to it will not be as significant as other signal delays.

The area required for one logic implementation in comparison to another depends on a combination of size and number of modules required, and on routing and programming resources available. A large complex logic module needs more physical area but can implement many logic functions, thus requiring a smaller total number of modules for a particular design. However, the logic modules may be underutilized, resulting in wasted logic gates. On the other hand, if the logic modules are too small and simple, many such modules will be required to implement a complex logic function, resulting in a large interconnection requirement. This requires a trade-off between the module size and the number of modules.

In addition, as the number of nets increase, routing becomes more involved. For a large number of nets, more channels, tracks, and feedthroughs may be required. More circuitry would also be required for programming the antifuses, all of which contribute to an increase in area.

It is thus desirable that the structure of a logic module should be that it can implement as many useful functions as possible using a single module.

The prior art module of FIG. 2 has eight inputs and one output, which is useful in implementing random logic, but may be inefficient for implementing a certain class of applications which require a frequent use of specific logic functions, such as would be used in a Digital Signal Processor.

DETAILED DESCRIPTION OF THE PREFERRED EMBODIMENT

Figure 1:
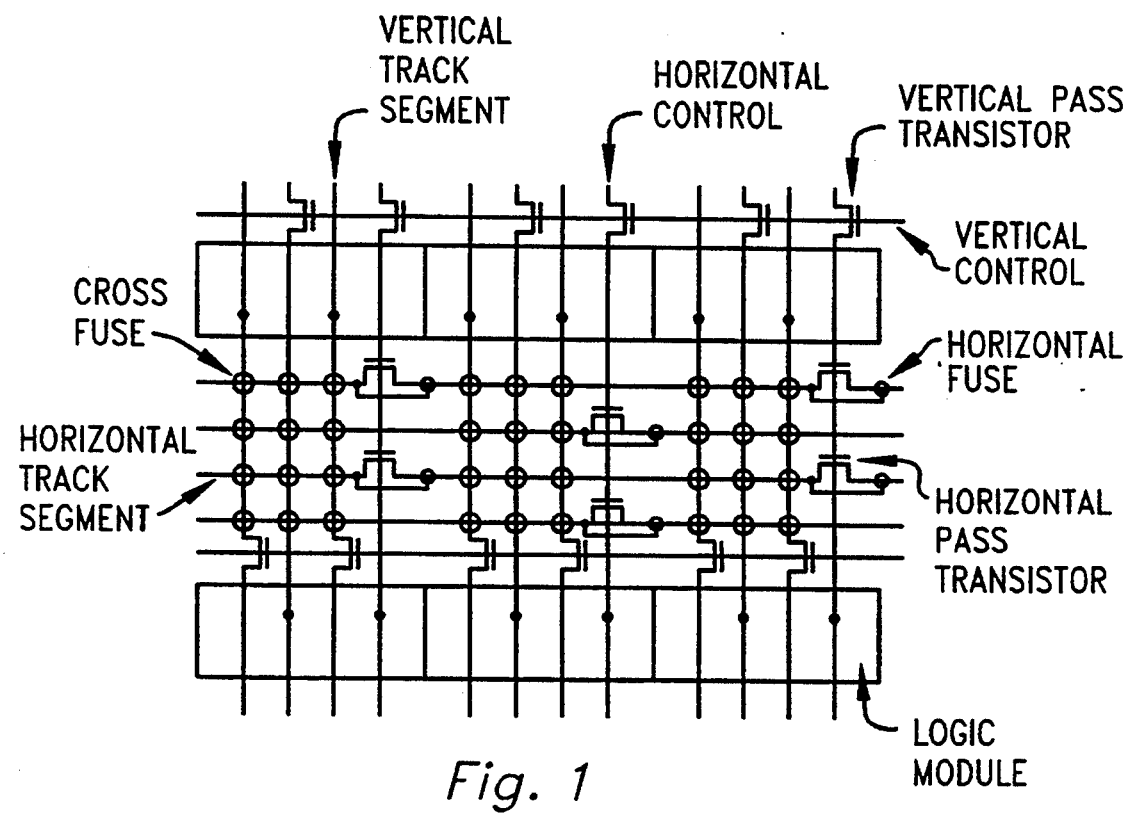
FIG. 1 is a partial diagrammatic representation of a portion of an FPGA.
Figure 2:
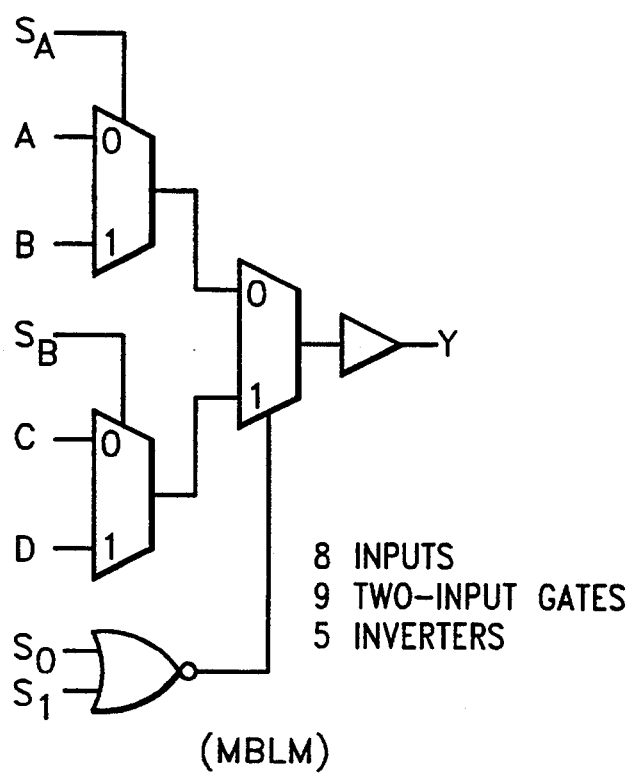
FIG. 2 is a prior art logic module used in the FPGA of FIG. 1.
Figure 3:
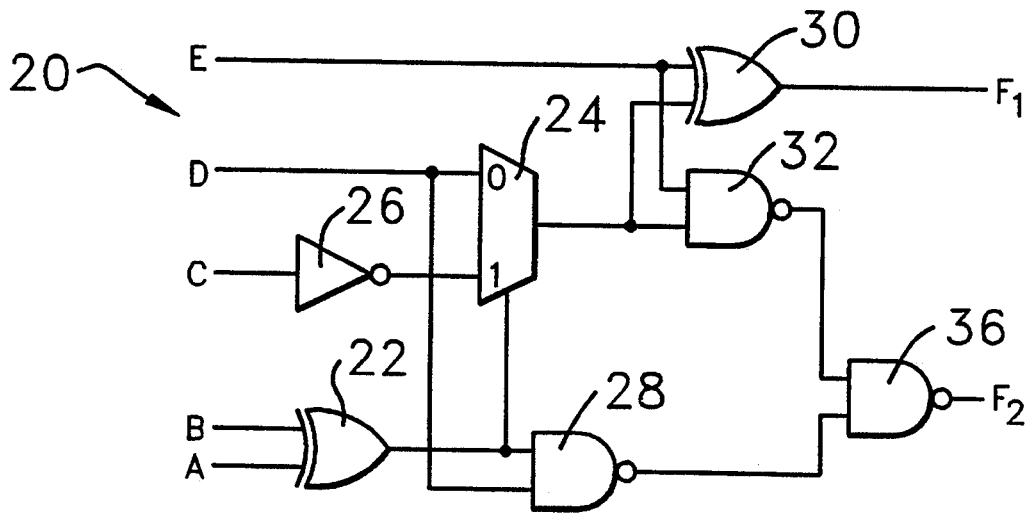
FIG. 3 is the logic module of the preferred embodiment of the present invention.

Turning to FIG. 3, there is shown the preferred embodiment of the logic module architecture of the present invention. The logic module 20 is an exclusive-or based architecture, as opposed to the Mux-based architecture of the prior art logic module of FIG. 2.

The logic module 20 has five inputs, labeled a–e in FIG. 3. Inputs a and b are connected to the inputs of an exclusive-or gate 22. Input c is connected to one input of a multiplexor 24 through an inverter 26. Input d is connected to the other input of the multiplexor 24, as well as to one input of a Nand gate 28. Input e is connected to one input of an Exclusive-or gate 30, as well as to one input of a Nand gate 32.

The XOR gate 22 has its output connected to the other one of the inputs of the Nand gate 28, as well as to the control input of Mux 24. The output of Mux 24 is connected to the other ones of the inputs of XOR gate 30 and Nand gate 32. The outputs of Nand gates 32 and 28 are connected to the inputs of a Nand gate 36. The outputs of Nand gate 36 and XOR gate 30 are the outputs of logic module 20.

While in the preferred embodiment as described above the logic module of the present invention has five inputs and two outputs, other configurations could also be used. The number of inputs and outputs in the preferred embodiment was selected based on being able to implement adders and subtractors for DSPs with only one module, rather than two. The optimal number of inputs was selected as five based on the trade-offs between number of modules used versus the functions implemented. The list of important Boolean functions which can be implemented using the preferred embodiment is shown below as Table 1.

TABLE 1

| Function Name | Function at $F_1$ | # of Pin Maps | Corresponding Functions at $F_2$ |
|---|---|---|---|
| EXOR2 | $a.\bar{b} + \bar{a}.b$ | 8 | $a.b, \bar{b} + a$ |
| EXNOR2 | $a.b + \bar{a}.\bar{b}$ | 3 | $\underline{a}.\underline{b}, \bar{b}.a$ |
| OR2 | $\underline{a} + b$ | 3 | $\underline{a}.\underline{b}, a + b$ |
| NOR2 | $\overline{a.b}$ | 3 | $\underline{a}.\underline{b}, a + b$ |
| AND2 | $\underline{a}.b$ | 3 | $a.b, a.\bar{b}$ |
| NAND2 | $\bar{a} + \bar{b}$ | 3 | $a, b$ |
| CSA | $a.b.\underline{c} + a.\bar{b}.\bar{c} + \bar{a}.b.\underline{c} + \bar{a}.\bar{b}.c$ | 2 | $a.c + b.c + a.b, a.\bar{b}, + a.\underline{b}$ |
| CSS | $\bar{a}.b.\underline{c} + a.\bar{b}.\underline{c} + a.b.c + \bar{a}.\bar{b}.\bar{c}$ | 2 | $a.\bar{c} + \bar{b}.\bar{c} + a.b, a.\bar{b} + a.b + \underline{c}$ |
| MUXA1 | $a.s + \bar{b}.\bar{s}$ | 2 | $\underline{c} + \underline{a}.b, \bar{a}.c + b$ |
| MUXA2 | $a.s + \bar{b}.\underline{s}$ | 1 | $a.\bar{b}$ |
| MUX | $a.s + b.\bar{s}$ | 2 | $c.(\bar{a} + b), \bar{a}.\bar{b}.\bar{c}$ |
| MUXI | $a.s + \bar{b}.\underline{s}$ | 2 | $c$ |

The total number of functions which can be implemented are as follows: 2 input: 8; 3 input: 31; 4 input: 22; 5 input: 2.

Figure 4:
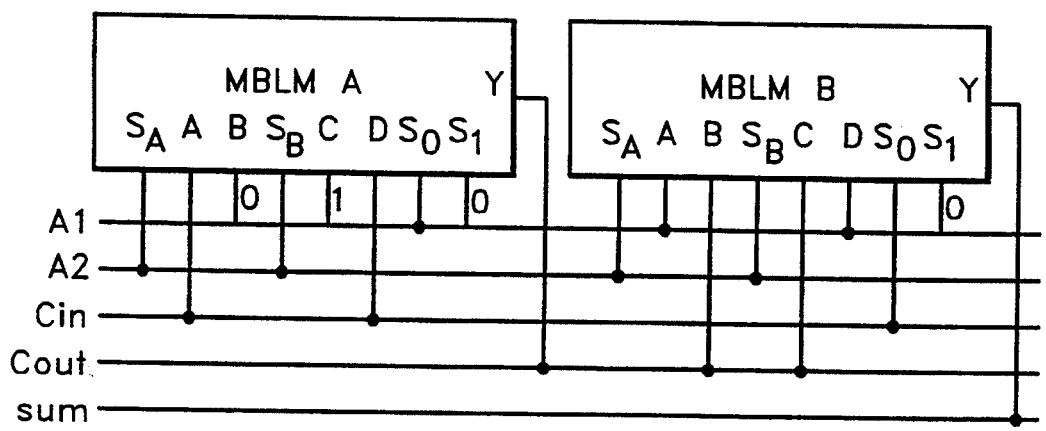
FIG. 4 is a full adder implementation utilizing the prior art logic module of FIG. 2.
Figure 5:
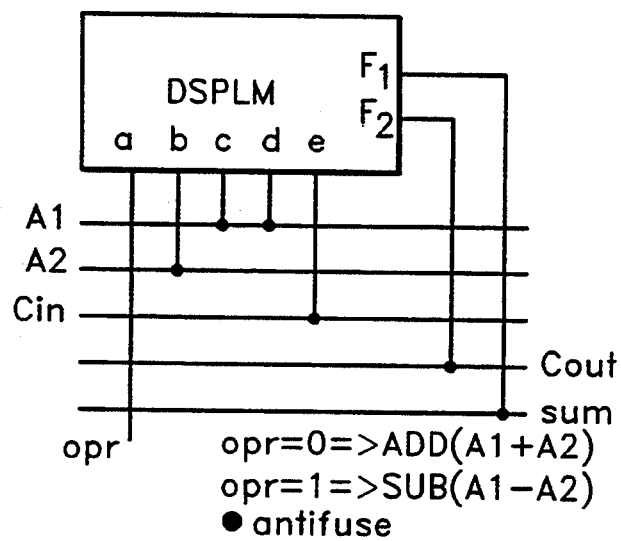
FIG. 5 is a full adder implementation utilizing the logic module of FIG. 3.

Utilizing the preferred embodiment in a full adder, the function can be accomplished with only one module, as shown in FIG. 5. The sum appears at F1, while the carry appears at F2. The input connections are as shown in FIG. 5. This can be contrasted with the adder implemented with the prior art logic module of FIG. 2, as is illustrated in FIG. 4. As can be seen in FIG. 4, two modules are needed, each with five antifuses to input the three adder inputs A,B, and Cin. Module A generates the carry which is then supplied to module B, adding two extra antifuses. Module B generates the output sum. The configuration of FIG. 4 requires 14 antifuses, while the implementation using the logic module of the present invention requires only six antifuses. This is useful in DSP architecture because it reduces the number of antifuses used and thus improves circuit performance.

Figure 6:
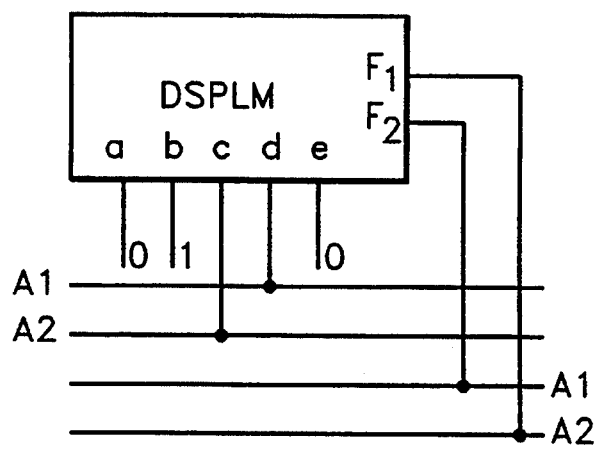
FIG. 6 is a Dual Buffer implementation utilizing the logic module of FIG. 3.
Figure 6A:
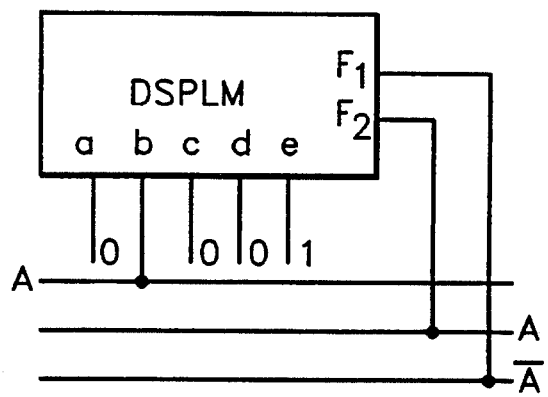
FIG. 6a is an Inverting/Non-inverting Buffer utilizing the logic module of FIG. 3.
Figure 7:
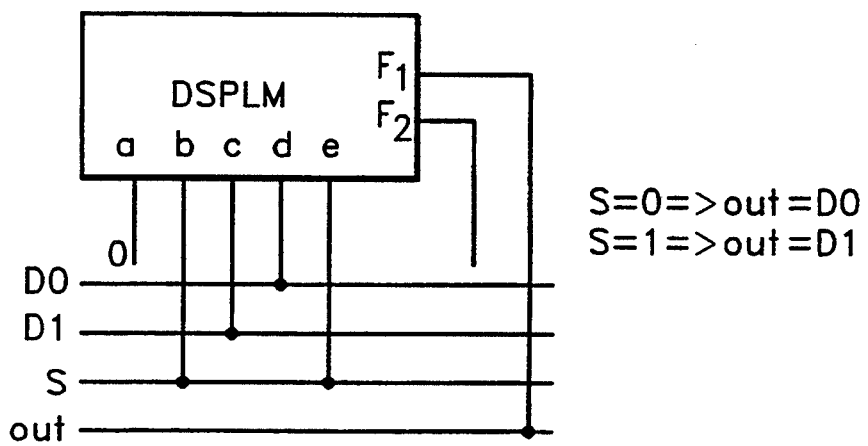
FIG. 7 is an implementation of a multiplexer utilizing the logic module of FIG. 3.
Figure 8:
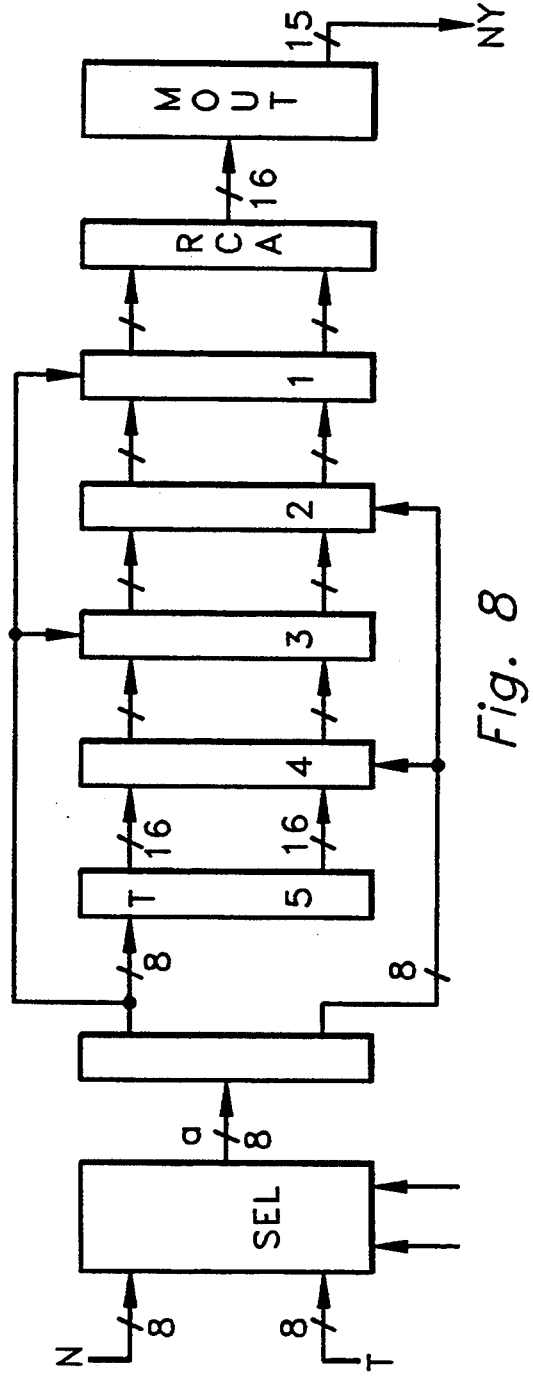
FIG. 8 is a diagrammatic depiction of a basic FIR filter useful in DSPs.
Figure 8A:
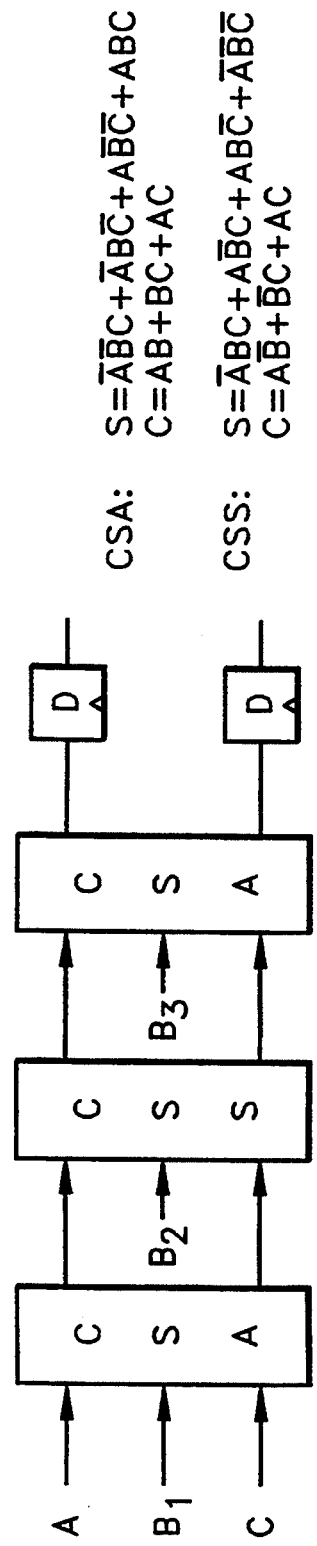
FIG. 8a is a diagrammatic depiction of one of the odd TAPS of FIG. 8.

Turning now to FIGS. 6 and 6a, there is shown a Dual buffer and an Inverting/Non-inverting Buffer implementation, respectively. In the case of a 64-tap filter, fan-out of certain signals will be very high: in some cases greater than 50. For a critical speed, maximum fan-out of the prior art module is 12, requiring buffering of the signals. The signals are typically 8 to 16 bits wide. Since only one signal can be buffered in the prior art module at any one time, if signals need to be buffered three times then 8×3, i.e., 24 prior art modules will be required for buffering only. However, as shown in FIG. 6, the logic module of the present invention can buffer two signals at once, cutting the required number of modules in half. FIG. 7 shows an implementation of a multiplexer using the preferred embodiment.

The logic module of the present invention is compared to the prior art module in Table 2 below using netlists of DSP circuits of varying sizes, where the size is defined in terms of the number of two-input nand gates used.

| Design Name | Size (2-input NANDs) | # module used | Total net length | Max fanout | Average fanout | Max channel density |
|---|---|---|---|---|---|---|
| Prior Art | 18211 | 3084 | 24466 | 117 | 4.25 | 17 |
| DSPLM | 18211 | 2105 | 14379 | 48 | 2.59 | 17 |
| Prior Art | 22747 | 3087 | 24964 | 142 | 4.15 | 18 |
| DSPLM | 22747 | 2105 | 14758 | 48 | 2.60 | 18 |
| Prior Art | 24267 | 3236 | 23368 | 178 | 4.23 | 19 |
| DSPLM | 24267 | 2350 | 12020 | 60 | 2.47 | 14 |
| Prior Art | 22747 | 2946 | 24647 | 142 | 4.13 | 20 |
| DSPLM | 22747 | 2207 | 20790 | 48 | 3.07 | 20 |

As described below, the DSPLM is very suitable for fulfilling logic function requirements in DSP applications.

A digital filter is one of the main components in any DSP application. A typical FIR filter architecture is depicted in FIG. 7. There are two modes of operation: the Run mode and the test mode. N and T are two 8-bit primary inputs. Input N is selected during the run mode while input T is chosen during the test mode by a series of multiplexers in the DATA_SEL block. This selected data $a$ goes through all the taps in the design. The number of these taps can vary from small numbers to large numbers in excess of 64 depending upon the filter design. This can lead to fan out problems and hence a driver block is used for buffering and generating $a$ and $\bar{a}$. In case of a large number of taps this single level buffering may not be sufficient and the tap design may need more buffers after certain intervals. The odd numbered taps, viz., taps 5,3 and 1 whose detail is shown in FIG. 4 are identical to each other. They consist of alternating Carry Save Adders (CSA) and Carry Save Subtractors (CSS). At the last stage, D-latches are used to store the final sum and carry. Taps 4 and 2 are similar to these taps except that their first element is a CSS instead of a CSA. The outputs of the taps go to the ripple carry adder (RCA) with the carry-out of the first stage being used as a carry-in for the next stage. MOUT is used to buffer the results at the output.

The filter architecture described above mainly requires the following logic functions: adders, subtractors, multipliers, and delay elements. Of these, subtractors are structurally identical to the adders except that one of their inputs needs to be inverted. A multiplier can be implemented with adders, subtractors and latches. Delay elements are again D-latches which can be implemented using a multiplexer. Thus, the main logic requirements of a DSP architecture are efficient implementations of adders and multiplexers. Counters and other control logic required to generate timing and controls signals can be implemented using the above mentioned logic blocks.

The adder function used above has two outputs, sum and carry. Thus for a single output logic module such as MBLM, a minimum of two modules are required, one to generate the sum and the other for the carry. This leads to an increase in circuit area even though it may be possible to implement the entire function in one logic module. Thus, it is apparent that a module should have at least two outputs in order to efficiently implement adder and other related functions. Also, since the outputs, sum and carry are computed from the same inputs, and some parts of the logic may be combined, it should be possible to implement both the output functions in one logic module.

The random logic required for control makes it imperative for a module to be able to implement at least all two input Boolean functions. Lastly, from the point of view of design for testability a logic module should be able to implement multiplexers that can be used to select run-time or test data.

I claim:

1. A logic module, comprising:
   five input terminals;
   two or more output terminals; and
   control logic for selectively coupling one or more of the input terminals to one of the output terminals.

2. The logic module of claim 1, wherein the number of output terminals is two.

3. The logic module of claim 1, wherein the control logic comprises:
   a plurality of interconnected exclusive-or and Nand logic gates.

4. The logic module of claim 1, wherein two of said input terminals are connected to the inputs of an exclusive-or logic gate.

5. The logic module of claim 1, wherein one of said input terminals is connected to one input of multiplexer and to one input of a Nand gate.

6. The logic module of claim 1, wherein one of said input terminals is connected to an inverter.

7. The logic module of claim 6, wherein the output of the inverter is connected to one input of a multiplexer.

8. The logic module of claim 1, wherein one of said input terminals is connected to one input of an XOR logic gate, the output of said gate forming one of said output terminals.

9. An integrated circuit, comprising:
   a plurality of input terminals;
   a plurality of logic modules each having a plurality of inputs, two or more outputs, and control logic for selectively coupling the inputs to the outputs;
   a plurality of programmable interconnect circuitry, said interconnect circuitry being adaptable to selectively connect one or more of said logic module for implementing a predefined logic function; and
   a series of horizontal and vertical track segments, the track segments being selectively connectible by programming antifuses located between each of said adjacent segments; and
   cross point fuses at the cross points of the horizontal and vertical tracks, said cross point fuses being selectively programmable to connect certain ones of said horizontal and vertical tracks.

10. The integrated circuit of claim 9, wherein said plurality of the logic modules are formed in rows interspersed with routing channels consisting of predefined tracks of horizontal interconnection segments.

* * * * *